US009134430B2

(12) United States Patent
Kahilainen et al.

(10) Patent No.: US 9,134,430 B2
(45) Date of Patent: Sep. 15, 2015

(54) DOSIMETRY APPARATUS, SYSTEMS, AND METHODS

(75) Inventors: Jukka Kahilainen, Discovery Bay, CA (US); Thomas Logan, Alamo, CA (US)

(73) Assignee: MIRION TECHNOLOGIES INC., San Ramon, CA (US)

(*) Notice: Subject to any disclaimer, the term of this patent is extended or adjusted under 35 U.S.C. 154(b) by 979 days.

(21) Appl. No.: 12/936,357

(22) PCT Filed: Apr. 6, 2009

(86) PCT No.: PCT/US2009/039676
§ 371 (c)(1),
(2), (4) Date: Oct. 4, 2010

(87) PCT Pub. No.: WO2009/126582
PCT Pub. Date: Oct. 15, 2009

(65) Prior Publication Data
US 2011/0024640 A1 Feb. 3, 2011

Related U.S. Application Data

(60) Provisional application No. 61/043,042, filed on Apr. 7, 2008.

(51) Int. Cl.
*G01T 1/24* (2006.01)
*G01T 1/02* (2006.01)
(Continued)

(52) U.S. Cl.
CPC . *G01T 1/026* (2013.01); *G01T 1/02* (2013.01); *G01T 1/14* (2013.01); *G01T 1/185* (2013.01);
(Continued)

(58) Field of Classification Search
CPC . G01T 3/008; G01J 2001/4446; G01J 1/0219
USPC ................... 250/300, 370.07, 370.14, 370.01
See application file for complete search history.

(56) References Cited

U.S. PATENT DOCUMENTS 5,235,318 A * 8/1993 Schulcz ........................ 340/505
5,248,456 A 9/1993 Evans, Jr.
(Continued)

FOREIGN PATENT DOCUMENTS

EP 0227134 7/1987
JP H11-258346 9/1999
(Continued)

OTHER PUBLICATIONS

PCT International Search Report and Written Opinion for PCT Application No. PCT/US2009/039676 mailed on Dec. 18, 2009.
(Continued)

*Primary Examiner* — David Porta
*Assistant Examiner* — Carolyn Igyarto
(74) *Attorney, Agent, or Firm* — Ladas & Parry, LLP

(57) ABSTRACT

A direct ion storage (DIS) radiation detector or dosimeter has a design that is easy and low cost to manufacture using semiconductor processing techniques. The detectors include internal communications interfaces so they are easy to read. Different interfaces, including wired, e.g. USB ports, and wireless interfaces, may be used, so that the dosimeters may be read over the internet. The detectors can thus be deployed or used in a variety of detection systems and screening methods, including periodic or single time screening of people, objects, or containers at a location by means of affixed dosimeters; screening of objects, containers or people at a series of locations by means of affixed dosimeters, and surveillance of an area by monitoring moving dosimeters affixed to people or vehicles.

62 Claims, 9 Drawing Sheets

(51) Int. Cl.
| | |
|---|---|
| *G01T 1/14* | (2006.01) |
| *H01J 47/00* | (2006.01) |
| *H01J 47/02* | (2006.01) |
| *G01T 3/08* | (2006.01) |
| *G01T 3/00* | (2006.01) |
| *H05K 5/02* | (2006.01) |
| *G01T 1/185* | (2006.01) |
| *G01T 7/00* | (2006.01) |

(52) U.S. Cl.
CPC . *G01T 1/24* (2013.01); *G01T 1/244* (2013.01); *G01T 3/00* (2013.01); *G01T 3/08* (2013.01); *G01T 7/00* (2013.01); *H01J 47/002* (2013.01); *H01J 47/005* (2013.01); *H01J 47/02* (2013.01); *H05K 5/0278* (2013.01)

(56) References Cited

U.S. PATENT DOCUMENTS

| | | | |
|---|---|---|---|
| 5,739,541 | A | 4/1998 | Kahilainen ............ 250/370.07 |
| 6,717,154 | B2 | 4/2004 | Black et al. ............... 250/393 |
| 6,792,487 | B2* | 9/2004 | Kao ................................ 710/74 |
| 7,119,676 | B1 | 10/2006 | Silverstrim et al. |
| 7,518,504 | B2 | 4/2009 | Peeters |
| 2004/0149918 | A1 | 8/2004 | Craig et al. |
| 2004/0200967 | A1 | 10/2004 | Russell |
| 2004/0204915 | A1 | 10/2004 | Steinthal et al. |
| 2005/0056791 | A1* | 3/2005 | Donaghue et al. ......... 250/394 |
| 2006/0033034 | A1 | 2/2006 | Kaplan et al. ........... 250/390.01 |
| 2008/0030597 | A1* | 2/2008 | Olsen et al. ............... 348/227.1 |
| 2008/0118087 | A1 | 5/2008 | Cheyne |
| 2008/0291744 | A1* | 11/2008 | Hasvold ................ 365/185.33 |
| 2009/0058663 | A1 | 3/2009 | Joshi et al. |
| 2009/0272192 | A1 | 11/2009 | Killion et al. |
| 2011/0063127 | A1 | 3/2011 | Matsumoto |
| 2012/0154170 | A1 | 6/2012 | Kahilainen |
| 2013/0334432 | A1 | 12/2013 | Kahilainen |
| 2014/0138557 | A1 | 5/2014 | Kahilainen |

FOREIGN PATENT DOCUMENTS

| | | |
|---|---|---|
| JP | 2005-233806 | 9/2005 |
| KR | 10-2003-0000346 | 1/2003 |
| KR | 10-0529181 | 11/2005 |
| WO | 97/08568 A1 | 3/1997 |
| WO | 2005008286 | 1/2005 |
| WO | 2006/056916 A1 | 6/2006 |
| WO | 2009107444 | 9/2009 |
| WO | 2009126582 | 10/2009 |
| WO | 2009157901 | 12/2009 |

OTHER PUBLICATIONS

ESSR dated Jul. 25, 2013 from corresponding European Patent Application No. 09730640.1.
Fiechtner, A., et al. "A prototype personal neutron dosemeter based on an ion chamber and direct ion storage." Individual Monitoring of External Radiation. European Workshop Sep. 4-6, 2000. vol. 96(1), Jul. 1, 2011. pp. 269-272, Radiation Protection Dosimetry Nuclear Technology Publishing UK.
Abson, et al. "A Twin Ion-Chamber system for Continuous Monitoring of Dose and Dose-Rate from Mixed Neutron and Gamma Radiation", Neutron Dosimetry: Proceedings of the Symposium on Neutron Detection, Dosimetry and Standardization Held by the International Atomic Energy Agency at the Atomic Energy Research Establishment, Harwell, England, Dec. 10-14, 1962, Symposium on Neu, vol. 2. Dec. 10, 1963, pp. 331-340.
Wernli, C., et al. "Direct ion storage dosimetry systems for photon, beta and neutron radiation with instant readout capabilities", Individual Monitoring of External Radiation. European Workshop Sep. 4-6, 2000 Helsinki, Finland, vol. 96(1), Jul. 1, 2011, pp. 255-259, Radiation Protection Dosimetry Nuclear Technology Publishing UK.
Kiuru, A., et al. "Comparison between direct ion storage and thermoluminescence dosimetry individual monitoring systems, and Internet reporting." Individual Monitoring of External Radiation. European Workshop Sep. 4-6, 2000. Helsinki, Finland, vol. 96(1), Jul. 1, 2011, pp. 231-233, Radiation Protection Dosimetry Nuclear Technology Publishing UK ISSN: 0144-8420.
Chapter I PCT International Preliminary Report on Patentability issued on Oct. 12, 2010 from corresponding application No. PCT/US2009/039676.
ISR for related PCT/US2011/064941 mailed on Jun. 18, 2012.
WO for related PCT/US2011/064941 completed on May 25, 2012.
IPRP for related PCT/US2011/064941 completed on Apr. 3, 2013.
External search report for U.S. Appl. No. 61/428,796 dated Nov. 28, 2011.
Office Action for U.S. Appl. No. 13/966,201 mailed on Dec. 19, 2013.
Office Action for U.S. Appl. No. 13/326,215 mailed on Dec. 19, 2013.
Office Action for U.S. Appl. No. 13/966,201 mailed on Apr. 4, 2014.
Office Action for U.S. Appl. No. 13/326,215 mailed on Apr. 22, 2014.
Office Action for related EP 09730640.1 issued on Sep. 8, 2014.

* cited by examiner

```
┌─────────────────────────────────────────────┐
│ Attaching a direct ion storage (DIS)        │
│ radiation dosimeter to a plurality of       │
│ objects, containers or persons to be        │
│ screened for radioactive sources; said      │
│ plurality of objects, containers or persons │
│ to be screened for radioactive sources      │
│ being transported from a first location to  │
│ a second location; said DIS radiation       │
│ dosimeter comprising: a first layer having  │
│ a MOSFET structure formed thereon by        │
│ semiconductor processing techniques, the    │
│ MOSFET structure having a floating gate     │
│ with an exposed surface; a second layer     │
│ having a concavity therein; a third layer,  │
│ having a concavity therein; the first layer │─── 200
│ being sandwiched between the second and     │
│ third layer, the three layers being bonded  │
│ together to form a hermetic seal; wherein   │
│ the concavity in the second layer, and the  │
│ concavity in the third layer, are aligned   │
│ with the exposed surface of the floating    │
│ gate and the concavity in the second layer  │
│ communicates with the concavity in the      │
│ third layer through the first layer to form │
│ an ion chamber; each dosimeter having an    │
│ integral wired (such as USB) or wireless    │
│ communications interface.                   │
└─────────────────────────────────────────────┘
                        │
                        ▼
┌─────────────────────────────────────────────┐
│ Reading each dosimeter through its          │
│ communications interface before the         │─── 202
│ associated object, container, or person     │
│ leaves the first location.                  │
└─────────────────────────────────────────────┘
                        │
                        ▼
┌─────────────────────────────────────────────┐
│ Reading each dosimeter through its          │
│ communications interface when the           │─── 204
│ associated object, container, or person     │
│ arrives at the second location.             │
└─────────────────────────────────────────────┘
                        │
                        ▼
┌─────────────────────────────────────────────┐
│ Transmitting data read from the dosimeters  │
│ at the first and second locations to a      │─── 206
│ central station.                            │
└─────────────────────────────────────────────┘
```

FIG. 9

DOSIMETRY APPARATUS, SYSTEMS, AND METHODS

CROSS-REFERENCE TO RELATED APPLICATIONS:

This application is the U.S. National Stage of International Patent Application No. PCT/US2009/039676 filed on Apr. 6, 2009, which claims the benefit of US Provisional Patent Application No. 61/043,042 filed on Apr. 7, 2008, the disclosures of which are hereby incorporated by reference in their entirety.

BACKGROUND

1. Field

This invention pertains generally to radiation detection, and more particularly to direct ion storage (DIS) dosimeters, and most particularly to their fabrication and data retrieval. The invention also pertains to radiation detection systems and methods based on multiple dosimeters, including multiple DIS dosimeters.

2. Description of Related Art

There are many different types of radiation detectors or dosimeters for monitoring exposure to hazardous ionizing radiation, such as x-rays, gamma rays, electrons and neutrons. These range from simple colorimetric film or badge dosimeters to complex electronic devices. Some devices are real-time; others show a cumulative exposure over a long period of time. A wide range of dosages may be detected.

One particular type is the direct ion storage (DIS) dosimeter, as shown in U.S. Pat. No. 5,739,541. A DIS dosimeter is based on a MOSFET with a floating gate on which a charge is placed. The surface of the gate is open to a space containing air or other gas, usually enclosed in a chamber. Ionizing radiation incident on the air or gas produces charge carriers that recombine with and thereby change the charge on the gate. The change in gate charge is detected and provides a measure of the incident radiation dosage. While an effective dosimeter, the DIS dosimeter has not been widely used because of the laborious (typically manual) and expensive fabrication process starting with a MOSFET transistor, altering the transistor to expose the gate, and hermetically sealing the modified transistor in a chamber.

There are many applications for dosimeters, from safety monitoring to industrial process monitoring to medical imaging and radiotherapy. A major application is personal dosimetry for people who may be exposed to radiation; these include medical workers and patients. At present, dosimeters are usually exchanged on a periodic basis with new dosimeters, and the old dosimeters are sent to a service provider who reads the dosimeters and provides data back to the user. Thus there is a lot of handling and transportation of the dosimeters.

One particular application of great interest today is the detection of potential terrorist threats using nuclear materials. Since there are many threat points, including airports, sea ports, border crossings, subways, large public buildings, shopping malls, and sports arenas, and many ways of transporting contraband nuclear material, including vehicles, shipping containers, luggage, and people, an effective system requires many dosimeters and real time data recovery. The military could also use dosimeters to locate nuclear materials and to monitor exposure of troops in the field.

To be widely used, a dosimeter should be low cost and easy to manufacture. Furthermore, to be effective, it must be easy to obtain data from the dosimeters in real time and to communicate this information to a collection point. In some cases the dosimeters may be widely distributed from the collection point; in other cases the dosimeters may all arrive at a common location. It would be particularly useful if the data could be collected using state of the art telecommunications technology, e.g. the Internet.

Therefore, it is desirable to provide a DIS dosimeter design that is low cost and easy to manufacture.

It is also desirable to provide a DIS dosimeter that has easy data readout capability, including a DIS dosimeter with internet connectability or other telecommunication interfaces.

It is further desirable to provide a system that can read a plurality of dosimeters in different locations or at a common location.

BRIEF SUMMARY

An aspect of the invention is a direct ion storage (DIS) radiation dosimeter, including a first layer having a MOSFET structure formed thereon by semiconductor processing techniques, the MOSFET structure having a floating gate with an exposed surface; a second layer having a concavity therein; and a third layer, optionally having a concavity therein; the first layer being sandwiched between the second and third layer, the three layers being bonded together to form a hermetic seal; wherein the concavity in the second layer, and any concavity in the third layer, are aligned with the exposed surface of the floating gate to form an ion chamber.

Another aspect of the invention is a direct ion storage (DIS) radiation dosimeter, including a MOSFET having a floating gate with an exposed surface; a data conversion interface electrically connected to the MOSFET; and a communications interface connected to the output of the data conversion interface; the data conversion and communications interfaces being integral to the dosimeter.

Also an aspect of the invention is a system for screening a plurality of persons, objects, or containers at a location for radiation exposure or for radioactive sources carried therein or thereon, including a plurality of dosimeters, a dosimeter being attached to each person, object, or container present at the location, each dosimeter having an integral communications interface; and a dosimeter reader at the location for reading each dosimeter through its communications interface on a one time or on a periodic basis. The reader is connected to a central station by wired or wireless communication.

A further aspect of the invention is a system for screening a plurality of objects, containers or persons being transported from a first location to a second location for radioactive sources carried therein or thereon, including a plurality of dosimeters, a dosimeter being attached to each object, container, or person present at the first location, each dosimeter having an integral communications interface; a first dosimeter reader at the first location for reading each dosimeter through its communications interface before the associated object, container, or person leaves the first location; and a second dosimeter reader at the second location for reading each dosimeter through its communications interface when the associated object, container, or person arrives at the second location.

Yet another aspect of the invention is a system for surveillance of an area for radioactive sources located therein, including a plurality of dosimeters, each dosimeter being attached to a person or a vehicle that moves through the surveillance area, each dosimeter having an integral wireless communications interface and a locator device; and a reader in communication with the dosimeters. The reader may be at a central station or communicate with a central station.

Yet a further aspect of the invention is a method for screening a plurality of persons, objects, or containers at a location for radiation exposure or for radioactive sources carried therein or thereon, by attaching a dosimeter to each person, object, or container present at the location, each dosimeter having an integral communications interface; and reading each dosimeter at the location through its communications interface on a one time or a periodic basis. Data read from each dosimeter at the location is transmitted to a central station for processing, and reports are received back from the central station, all electronically.

Another aspect of the invention is a method for screening a plurality of objects, containers or persons being transported from a first location to a second location for radioactive sources carried therein or thereon, by attaching a dosimeter to each object, container, or person present at the first location, each dosimeter having an integral communications interface; reading each dosimeter through its communications interface before the associated object, container, or person leaves the first location; and reading each dosimeter through its communications interface when the associated object, container, or person arrives at the second location.

Also an aspect of the invention is a method for surveillance of an area for radioactive sources located therein, by attaching a plurality of dosimeters to persons or vehicles that move through the surveillance area, each dosimeter having an integral wireless communications interface and a locator device; and monitoring the plurality of mobile dosimeters at a reader in communication with the dosimeters. The reader may be at a central station or data from a reader can be sent to a central station.

Further aspects of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only:

FIG. 9 illustrates an embodiment of a method according to the invention.

DETAILED DESCRIPTION OF THE INVENTION

Referring more specifically to the drawings, for illustrative purposes the present invention is embodied in the apparatus, systems, and methods generally shown in FIG. 1A through FIG. 6. It will be appreciated that the apparatus and systems may vary as to configuration and as to details of the parts, and the methods may vary as to the particular implementation, without departing from the basic concepts as disclosed herein.

Figure 1A:
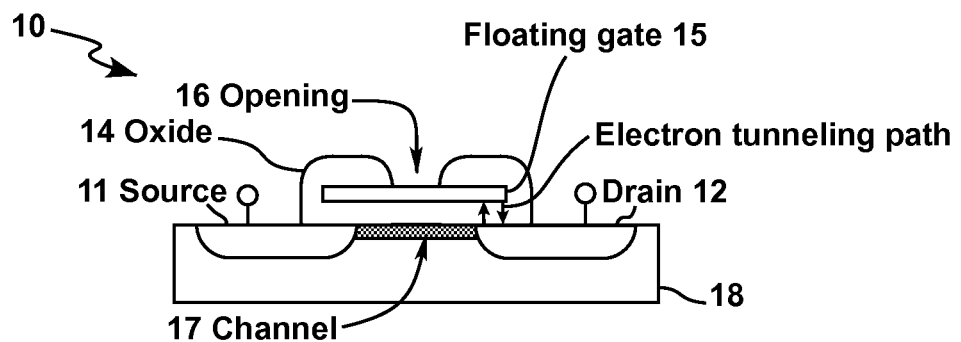
FIGS. 1A, B are cross-sectional views of a basic prior art DIS radiation detector, without and with a surrounding conductive wall.

One aspect of the invention is directed to an improved direct ion storage (DIS) dosimeter, and methods of making same. The basic configuration of the DIS dosimeter is shown in U.S. Pat. No. 5,739,541, which is herein incorporated by reference. As shown in FIG. 1A, DIS detector 10 is a modified MOSFET transistor and has a source 11 and a drain 12 separated by a channel 17 formed on a substrate 18. The DIS detector 10 also has an oxide layer 14 on the substrate 18 covering channel 17 and at least a portion of source 11 and dram 12. A floating gate 15 is provided in the oxide layer 14, spaced above channel 17 and extending between source 11 and drain 12. Oxide layer 14 has an opening 16 therein over the floating gate 15 so that at least a portion of the surface of the floating gate 15 is uncovered and electrically non-insulated. Opening 16 forms an air or gas space in direct contact with floating gate 15.

In operation, a charge is placed on floating gate 15, e.g. by applying a voltage between source 11 and drain 12. When ionizing radiation is incident on the air or other gas above the (charged) floating gate 15, charge carriers will be produced and these will cause a change in the charge on the gate 15 because of recombination. The change in charge on the gate 15 is a measure of the radiation dosage. The change in charge on the gate 15 can easily be measured, without disturbing the charge on the gate 15, by measuring the conductivity of channel 17 between source 11 and drain 12.

Figure 1B:
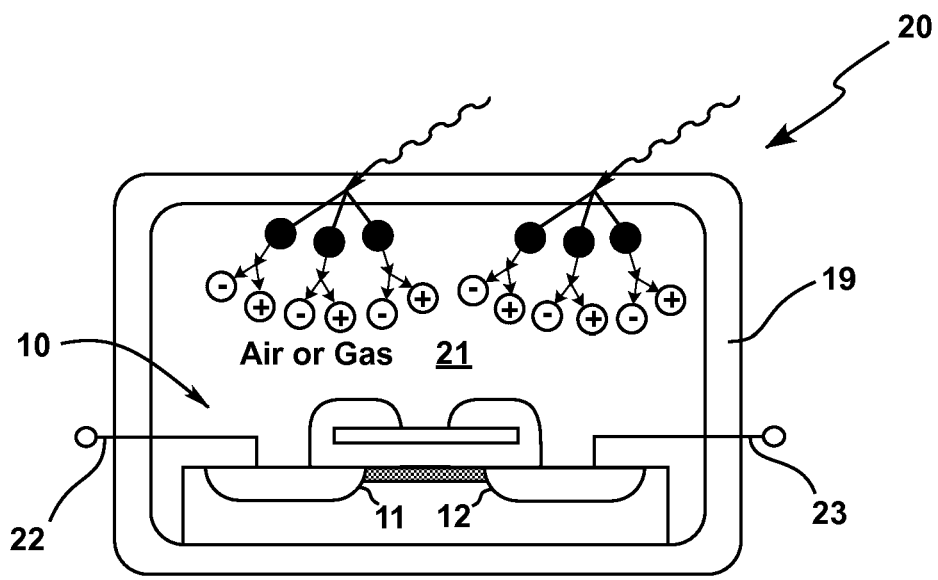

The basic DIS radiation detector 10 of FIG. 1A may be enclosed in a conducting wall 19 to produce DIS dosimeter 20 having a closed ion chamber 21 filled with air or other gas as shown in FIG. 1B. Depending on the wall material and thickness, and the type of radiation, the incident radiation may interact with the wall and produce secondary electrons which then ionize the air or gas in the ion chamber 21, or the radiation may penetrate through the wall 19 and directly ionize the air or gas in chamber 21. In either case, the ionized air or gas in chamber 21 will cause a change in the gate charge of the MOSFET that is proportional to the radiation dosage. Electrical leads 22, 23 to source 11 and drain 12 extend out from dosimeter 20 so that charge may be applied to the gate or gate charge changes (i.e. channel conductivity changes) can be measured. If a particular type of radiation is being detected, materials that interact with that radiation should be used for the wall. For example, for thermal neutron detection, boron or lithium containing materials, e.g. plastic with boron nitride or polyethylene with lithium nitrate, could be used, while for photon detection, the walls could be made of teflon or graphite.

Figure 2A:
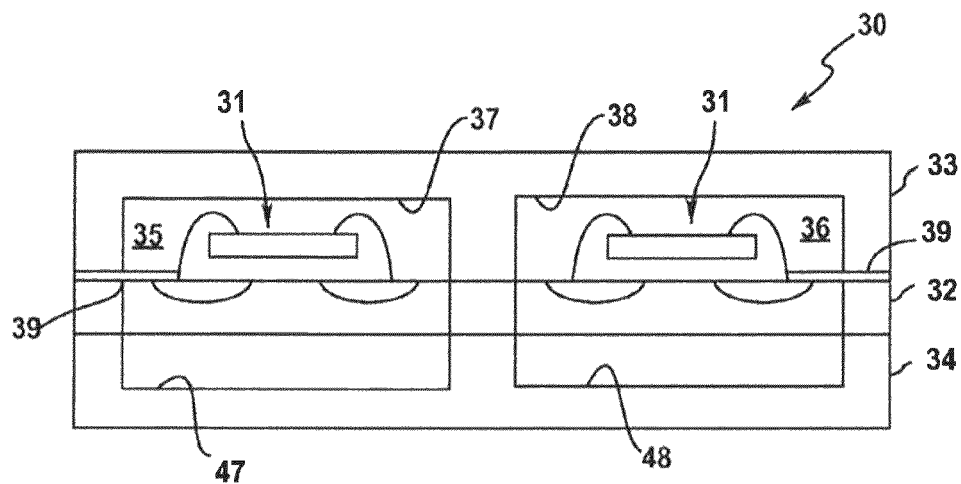
FIGS. 2A, B are a cross-sectional view and an assembly drawing of a three layer dual chamber DIS dosimeter of the invention.

The invention includes a simplified three layer single or multiple ion chamber DIS radiation detector configuration, based on the above described principles, made by semiconductor packaging techniques, and methods of making same. FIG. 2A shows an illustrative DIS radiation detector 30 of the invention having two chambers, but the invention includes single chamber and more than two chamber detectors. Detector 30 is made of three modular layers 32, 33, 34, which can each be manufactured by automated processes. The three layers are then brought together and hermetically sealed together, again by automated processes, to form the detector 30, with two ion chambers 35, 36. The middle layer 32 is the MOSFET layer; it is fabricated using standard semiconductor fabrication equipment and processes, typically on a silicon substrate. MOSFET layer 32 is formed by conventional steps of deposition, doping, and etching so that it has two MOSFET structures 31 with exposed floating gates as described above and as illustrated in FIG. 1A. MOSFET layer 32 also has conducting electrical lines 39 formed thereon so that electrical connection can be made to the source and drain of the MOSFET structures 31 from outside the radiation detector 30.

Figure 2B:
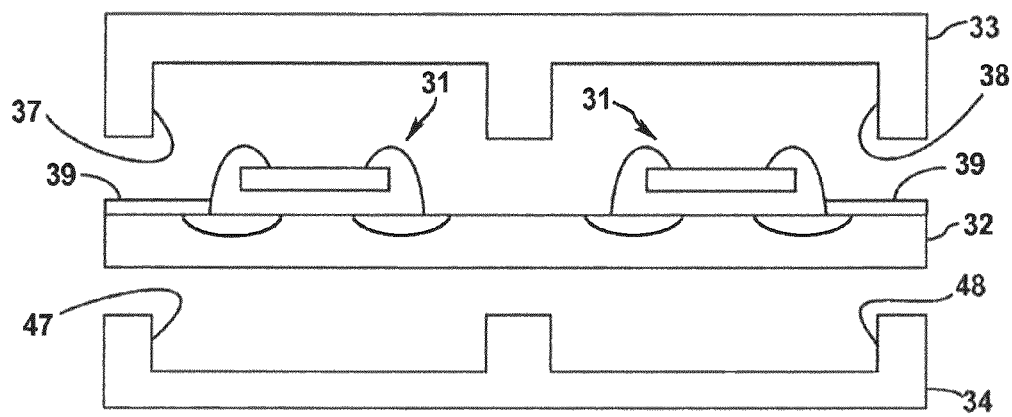

Top and bottom layers 33, 34 are also made by automated processes, typically of metal or conducting polymer, in sizes and shapes to match the MOSFET layer 32. Top layer 33 includes concavities 37, 38 and bottom layer 34 contains concavities 47, 48 so that when top and bottom layers 33, 34 are brought together with and hermetically sealed to MOSFET layer 32, ion chambers 35, 36 are formed. Not shown in FIG. 2A but similar to what is shown hereafter in relation to FIG. 7, concavity 37 in top layer 33 communicates with concavity 47 in bottom layer 34 through MOSFET layer 32 to increase the size of ion chamber 35; likewise for cavities 38, 48 and ion chamber 36. Alternatively, the bottom layer 34 may be substantially flat, and top cavities 37, 38 alone form the ion chambers 35, 36. For assembly, the three layers 32, 33, 34 are aligned and brought together, with MOSFET layer 32 sandwiched between top layer 33 and bottom layer 34, as shown in FIG. 2B, and bonded together. The electrical lines 39 communicate externally through the detector 30 and are connected to standard electrical connectors (not shown) so that charge may be placed on the floating gate and changes in charge on the gate may be measured. In a simplified two layer embodiment, the bottom layer 34 can be eliminated and the detector is formed by sealing the top layer 34 to the MOSFET layer 32.

The two ion chambers 35, 36 may be of different sizes for different radiation dosages. The pressures in the chambers may be selected for desired sensitivity. Different gases may be used in the two chambers. Thus the dosimeters can be tailored to the application.

Figure 3:
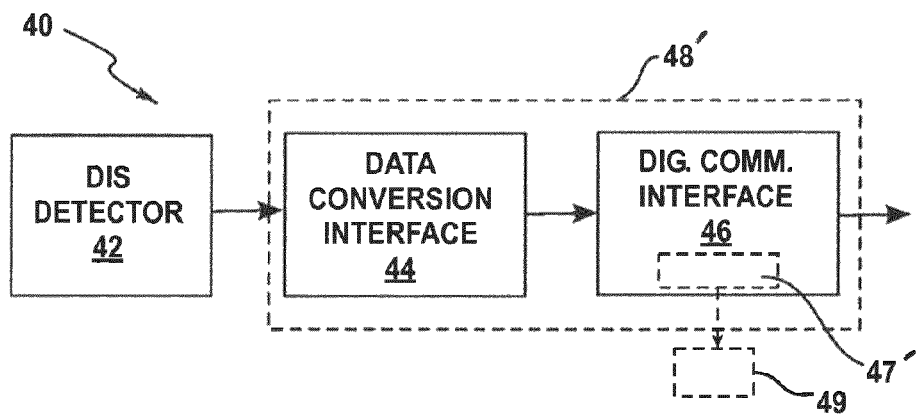
FIG. 3 is a block diagram of the components of a DIS dosimeter of the invention having an internal readout.

To best utilize the DIS radiation detector of FIGS. 1A, B, and in particular the improved DIS radiation detector configuration of FIG. 2A, the invention further includes a radiation sensor package with an integrated communications interface, as shown in FIG. 3. In the radiation detector package 40, the analog output of a DIS radiation detector 42 passes through a data conversion (or signal conversion) interface 44, e.g. an analog-to-digital (A/D) converter, and the digitized output of data conversion interface 44 is input to digital communications interface 46. The data conversion and digital communications interfaces 44, 46 may be combined in a data collection and data readout integrated circuit 48'.

Interface 46 allows the dosimetry data to be communicated to many different systems. Interface 46 can be selected from any of many available digital interface technologies, particularly those for interfacing to the Internet. One particular preferred interface is a USB port, allowing direct connection or connection by USB cable to various readers. Any other wired interface can also be used. Another preferred interface is a wireless telecommunication interface, allowing wireless transmission of the data to various readers. The invention does not depend on a particular implementation of the data conversion and communications interfaces, but may be implemented with any presently available or future technologies. The implementation may include any and all features that are available with these technologies. For example, the implementation may include tamper proof algorithms, hardware or software to insure integrity of the system; features such as data integrity checking algorithms and encryption would normally be included.

The invention further includes a modular integrated DIS radiation sensor or dosimeter package, as shown in FIGS. 4A-E. The modular integrated DIS radiation sensor package 50 is contained in a compact housing 51, typically made of plastic. Housing 51 has an aperture 52 in one end thereof. Sensor package 50 also includes a DIS radiation dosimeter or sensor 54 of the general type shown in FIGS. 1A, B, and more preferably the configuration shown in FIG. 2A. The DIS radiation sensor 54 is electrically connected to an associated data collection and data readout integrated circuit 56. DIS sensor 54 and integrated circuit 56 are mounted on a support frame 55 that fits into and is slidably mounted to housing 51. Integrated circuit 56 includes a USB port or connection 57 at one end thereof. Metal bracket 58 forms a shield to USB port or connection 57 of integrated circuit 56. Bracket 59 is also part of the internal sensor and circuit assembly 64. More generally, integrated circuit 56 includes the data or signal conversion interface 44 and digital communication interface 46 of FIG. 3. It provides for data collection from sensor 54 and data readout from sensor package 50. In an alternate embodiment, integrated circuit 56 may have a wireless communication interface in place of the USB port. Sensor package 50 may include, but does not require, an internal power source, e.g. a battery. Once the DIS sensor 54 has been charged from an external source, it will function as a dosimeter, i.e. the stored charge will change upon exposure to radiation. Integrated circuit 56 can be powered externally, e.g. inductively or RF interrogation, or by electrical connection, when it is desired to read the data.

Figure 4A:
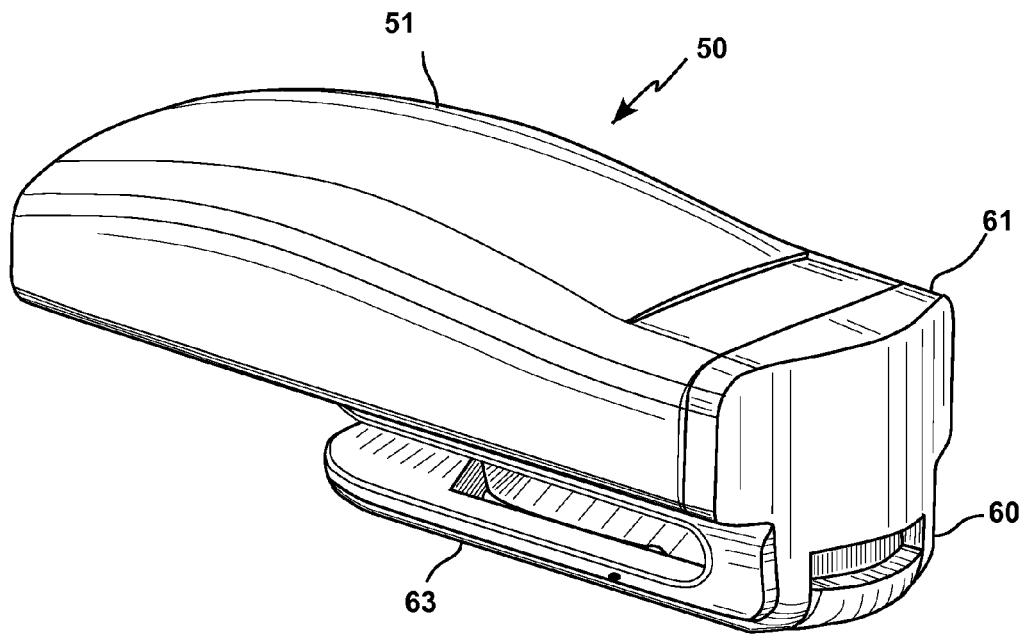
FIGS. 4A-C are a perspective, an assembly, and a partly assembled and partly in section drawing of a DIS dosimeter package of the invention.
Figure 4D:
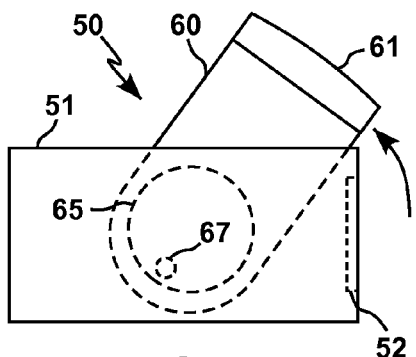
FIGS. 4D-E are top views showing the operation of the pivotable base element of the DIS dosimeter package of FIGS. 4A-C.
Figure 4E:
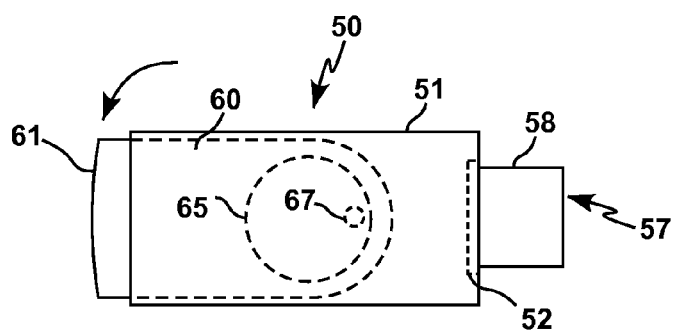
Figure 4B:
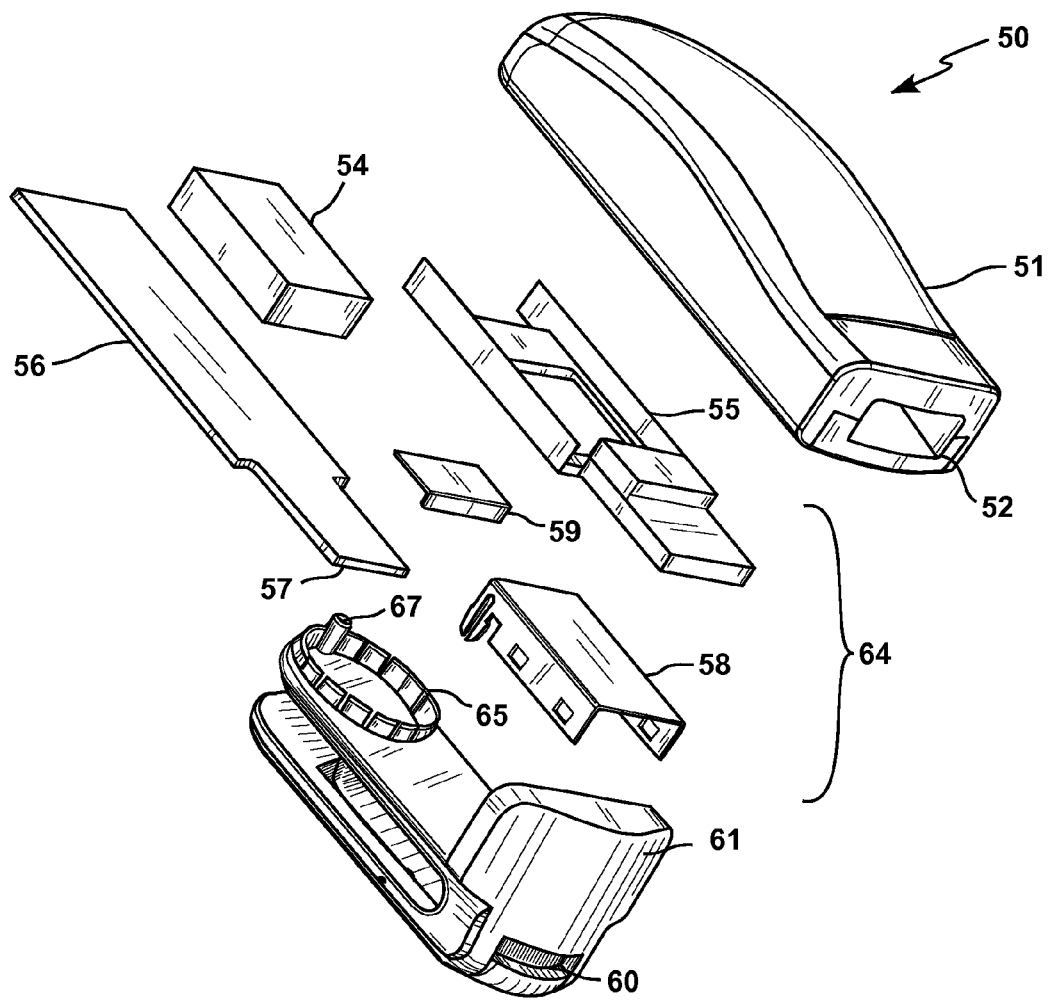
Figure 4C:
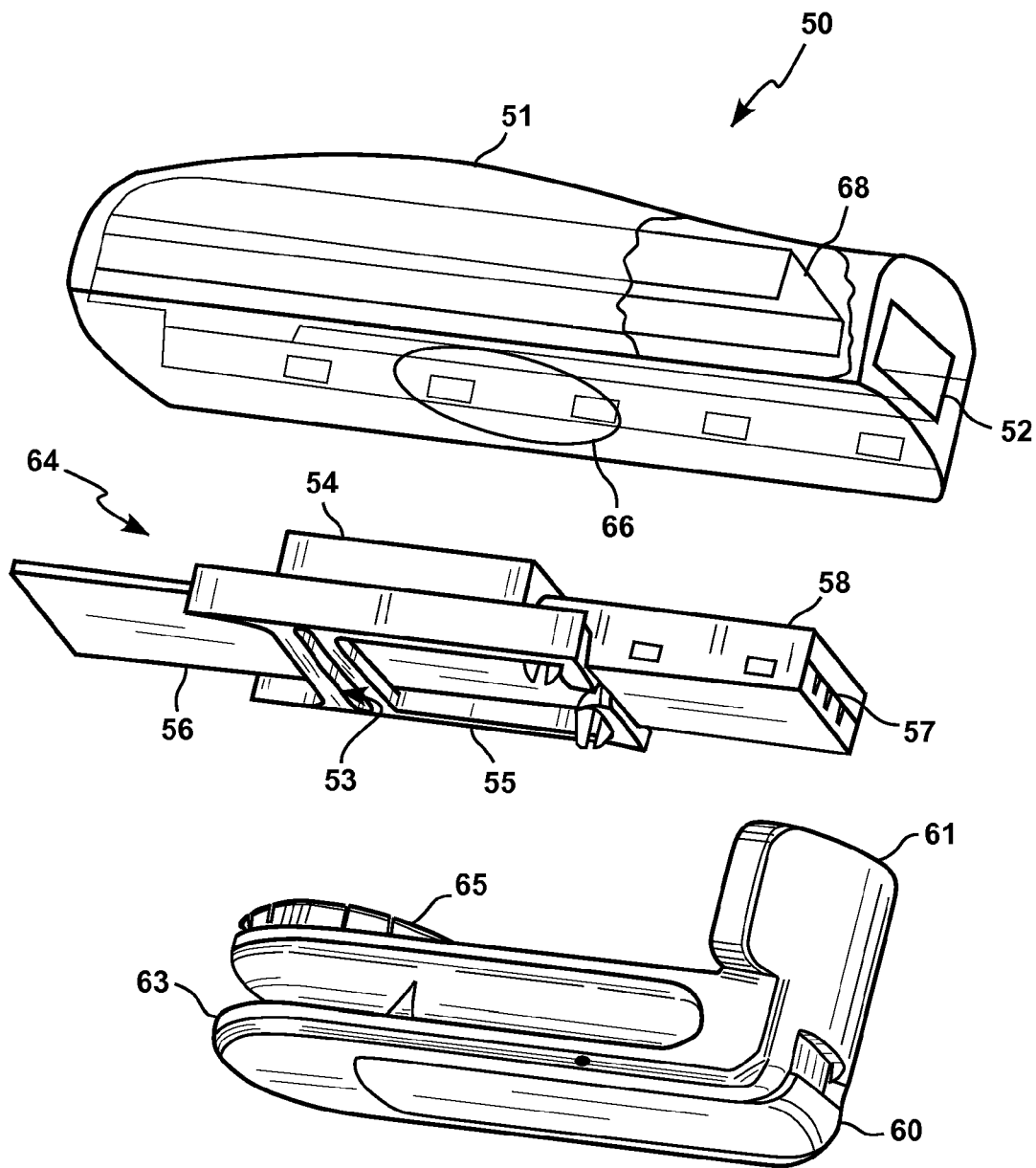

A base element 60 having a protective aperture closing flange 61 extending therefrom is pivotably mounted to the bottom of housing 51 so that flange 61 normally covers the aperture 52, as shown in FIG. 4A. Base element 60 has a mounting ring 65 that snaps into circular aperture 66 on the bottom of housing 51. A rod 67 also extends upwardly from the ring 65; rod 67 is distal from flange 61. Rod 67 engages a slot 53 on the bottom of frame 55. Flange 61 is rotated away from aperture 52, as shown in FIGS. 4D-E, when it is desired to connect USB port 57 to an external reader. As base element 60 is rotated, camming action by rod 67 slides the frame 55 forward toward the aperture 52. When flange 61 has been rotated 180, frame 55 has been fully translated forwards so that USB connector 57 extends out from aperture 54, and may be plugged into the USB port of a digital computer or other reader. Alternatively, closing flange 61 could be hinged at the bottom so that it could be folded down away from the aperture 52 and other mechanisms may be used to slide the frame forward to extend the USB port 57. Base element 60 also includes a clip 63 for easy attachment to a person or object. Other attachment means could also be used. An optional radiation shield 68 may also be mounted in the housing 51, inside the top, over DIS sensor 54 to shield from certain radiation.

Figure 5:
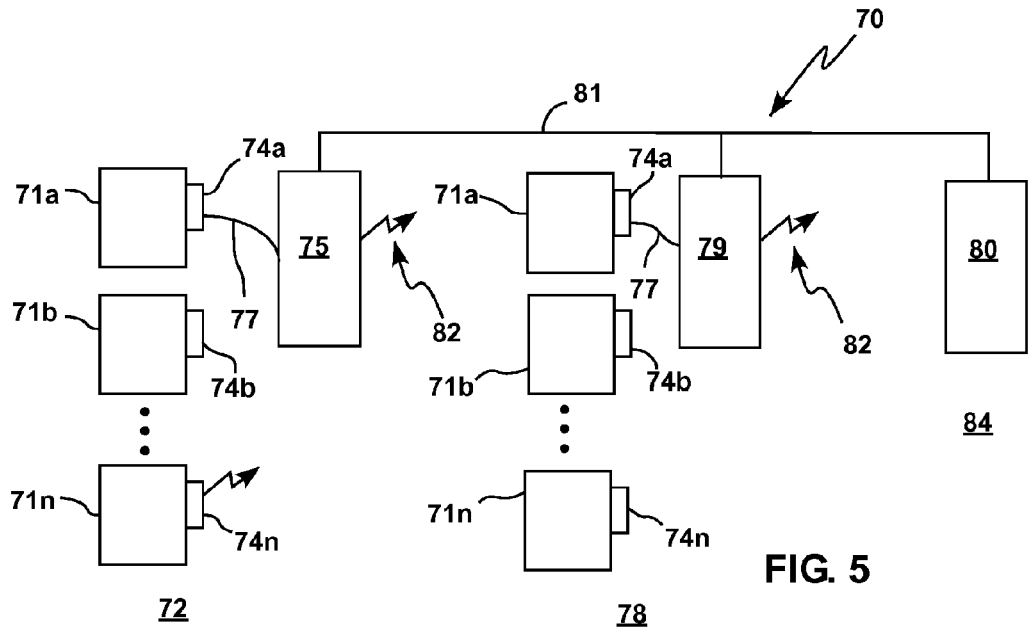
FIGS. 5-6 are block diagrams of radiation detection systems of the invention based on a plurality of dosimeters.

FIG. 5 illustrates a radiation detection system 70 of the invention. A plurality (n) of objects, containers, or people 71a, 71b ... 71n at a first location 72 each have a radiation dosimeter 74a, 74b ... 74n affixed thereto. The dosimeters 74a ... 74n are preferably DIS dosimeters as described above but may include other types of dosimeters such as TLD (thermoluminescent), OSL (optically stimulated luminescent), RPL (radiophosphorluminescent), radiochromic (RC) and MOSFET (old type, not DIS) dosimeters. In general, any type of passive dosimeter can be used. As a physical property changes when exposed to radiation, the change can be measured. However, all the dosimeters have a built in communications interface, e.g. as shown in FIG. 3. For example, any of these other types of dosimeters could replace DIS sensor 54 in sensor package 50 of FIG. 4A-E.

Also located at the first location 72 is a first reader 75 for reading the data from each of the dosimeters 74a . . . 74n. Reader 75 may be any type of device that can collect the data from the dosimeters through the built in communications interfaces of the dosimeters. For example, reader 75 may be connected to a dosimeter by a USB cable 77, as shown with dosimeter 74a, or the reader 75 may be in wireless communication with a dosimeter, as shown with dosimeter 74n. Reader 75 may also be directly connected to the dosimeter using an extendable USB connector as shown in FIG. 4E. Reader 75 may typically be a PC.

The individual dosimeters 74a . . . 74n do not have to have an internal power source, e.g. batteries, which may be removed or otherwise become disabled. The individual dosimeters 74a . . . 74n may instead be inductively powered, e.g. by the reader 75. This will ensure that at the time that it is desired to read a particular dosimeter to determine if the associated object, container, or person contains, is carrying, or has been exposed to radioactive material, the dosimeter will be properly powered.

Location 72 may be a single location where dosimeter monitoring occurs on a continuous or periodic basis. For example, it may be a nuclear reactor or medical radiotherapy center where system 70 is used for personal dosimetry. The personnel 71a . . . 71n at the location 72 are subject to periodic readings of the dosimeters 74a . . . 74n that they wear while present. This is done by simply reading the dosimeters at scheduled intervals by the on site reader 75, e.g. by USB or wireless connection. Location 72 may also be a location where visitors are screened upon leaving or a processing facility where products are screened when being shipped. For example it may be a manufacturing facility where shipping containers are screened prior to shipment by attaching a dosimeter and reading the dosimeter at the on site reader to detect any residual radiation or radioactive contaminants. Location 52 could be in camp or field headquarters in a military theater, where soldiers plug in to a PC to monitor possible exposure or to locate hidden weapons. The PC can be in wireless or wired communication with a central command post. Location 52 could also be an airport where arriving flight crews could have their dosimeters read to monitor exposure to cosmic rays.

Location 72 may also be the point of origin, e.g. an airport, a seaport, a railroad station, or a factory, of objects, containers or people 74a . . . 74n that are to be transported to a second location. The set of dosimeters 74a . . . 74n and the reader 75 allow an assessment of whether any radioactive material is present prior to transport to a second location 78, the point of destination. Any objects, containers or people for which the dosimeters show the presence of radiation can be removed or otherwise investigated. The remaining objects, containers or people, with their affixed dosimeters, can then be transported to location 78.

At location 78, a second reader 79 is present and the data on the affixed dosimeters is again read. Reader 79 is similar to reader 78 and reads the data from the dosimeters through the built in communications interface. This second reading at the destination location prevents radioactive material from being picked up or added after leaving the first location. Again, if any of the objects, containers or persons read positive for radiation, they can be isolated and not passed on.

The readers 75, 79 at locations 72, 78 may also be in communication with a central station 80 at a third location 84. This communication may be over wires 81 or by wireless links 82. Central station 80 may collect all the data from a plurality of locations and coordinate security or monitoring efforts. For example, in the case of personal monitoring on a periodic basis at a single location, central station 80 collects the data from the reader at that location and sends back dosimetry reports. Since the communications system can be implemented on the internet, the reports can be sent on the internet, and viewed by personnel back at the monitored location. Thus, the physical transfer of dosimeters and paper reports is eliminated. In the case of transport of containers between two locations, central station 80 can receive data from reader 75 at origin location 72, process the data, and provide a report, on the Internet, that is available at destination location 78 by the time the containers arrive there. Reports back to any location can be very rapid since data collection, processing and reporting are all done electronically.

The invention includes methods of detecting radiation exposure or radiation sources through a system of dosimeters as illustrated in FIG. 5. One method involves screening at a single location, either singly or on a periodic basis. This method includes screening a plurality of objects, containers, or people at the location by reading out dosimeters affixed to the objects, containers or people through communications interfaces in the dosimeters. The dosimeters are read locally; the data may then be transmitted to a remote central station for processing, report preparation etc. Another method tracks objects, containers or people from one location to another. The method includes first screening a plurality of objects, containers, or people at a first location by locally reading out dosimeters affixed to the objects, containers or people through communications interfaces in the dosimeters. After transport to a second location, the same plurality of objects, containers or people are again screened by locally reading out the affixed dosimeters through their communications interfaces. The readouts from the first and second locations may also be transmitted to a central station. In both methods, readout of the dosimeters at the locations, and communications from the locations to the central station and back are all electronic and thus very rapid. The methods can be implemented on the internet for easy access by users.

Figure 6:
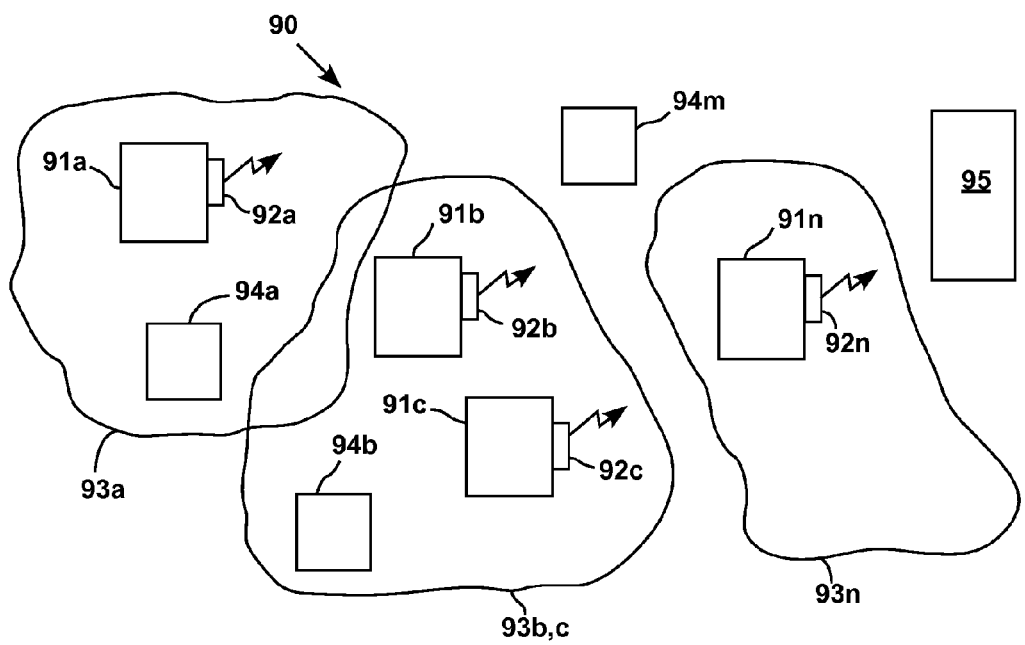

FIG. 6 illustrates a radiation detection system 90 of the invention. A plurality (n) of people or vehicles 91a, 91b . . . 91n each have a radiation dosimeter 92a, 92b . . . 92n affixed thereto. The dosimeters 92a . . . 92n are preferably DIS dosimeters as described above but may include other types of dosimeters such as TLD, MOSFET, RPL, RC and OSL dosimeters. However, all dosimeters have a built in communications interface, e.g. as shown in FIG. 3. The communications interface preferably is a wireless communications interface so that it may send data from any location. Each person or vehicle 91a . . . 91n moves through an associated area 93a . . . 93n. The areas 93a . . . 93n may overlap, as 93a and 93b, or even be coincident, i.e. multiple persons or vehicles could cover the same area, as 93b and 93c.

The individual dosimeters 92a . . . 92n all communicate with a central station 95, e.g. wirelessly. Central station 95 includes a reader for reading the data from each of the dosimeters 92a . . . 92n. The reader may be any type of device that can collect the data from the dosimeters through the built in communications interfaces of the dosimeters. Alternatively, there could be a number of readers 94a, 94b . . . 94m placed at nearby locations, i.e. either inside areas 93a . . . 93n, as reader 94a or 94b, or close to an area, as reader 94m. The persons or vehicles could then wirelessly communicate with a nearby reader or go to the reader and have the dosimeter read; the reader would then transmit the data to the central station.

As the individual persons or vehicles move through the areas, the associated dosimeters will monitor the surroundings. These dosimeters will generally carry their own power source, e.g. batteries, or be connected to the vehicle electrical system; alternatively they could be externally powered, e.g. inductively or by RF interrogation. Any positive signals from the dosimeters will be monitored by the central station, either directly or through localized readers. The dosimeters can include a GPS or other tracking device so that its location can readily be determined. Again, because data collection and transmission are all electronic, identification of any problems can be almost instantaneous.

The invention includes a method of detecting radiation sources using the system of dosimeters as shown in FIG. 6. A plurality of mobile dosimeters are provided, e.g. by being carried on or being affixed to people, e.g. mailmen or meter readers, or vehicles, e.g. police cars, buses, taxis or delivery trucks. The mobile dosimeters include internal communications interfaces, preferably wireless. As the people or vehicles with the dosimeters move through an area, either on a fixed route or at random, a central station monitors the dosimeters through the dosimeter communications interfaces. Alternatively the dosimeters may be read by local readers, e.g. at the post office or police stations, and the local readers transmit the data to the central station. One particular application is for military personnel in the field. While patrolling or even during battle, the dosimeters, either on the soldiers or on their vehicles, can be in communication with a reader to provide essentially real time information about radiation exposure.

Figure 7:
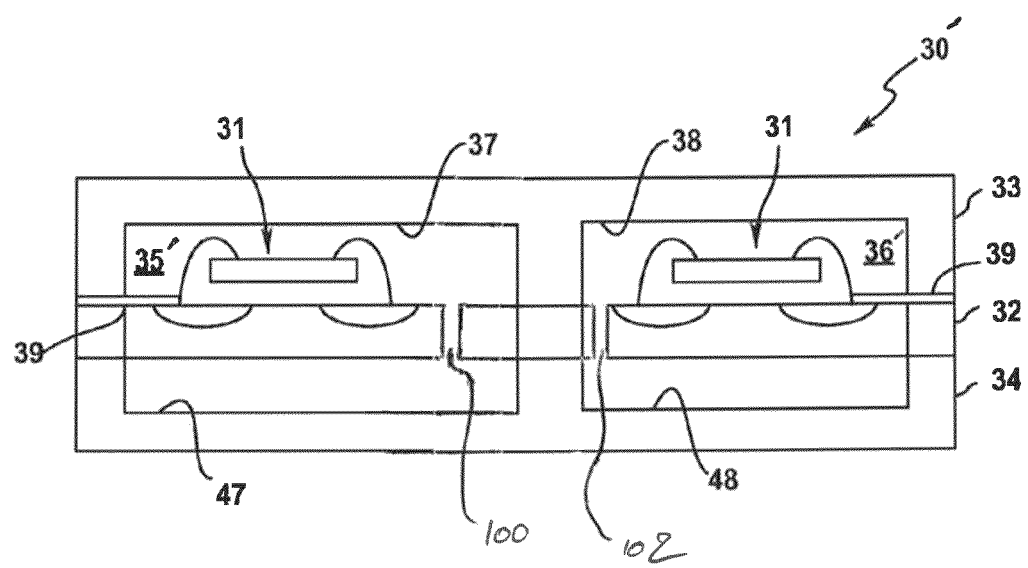
FIG. 7 illustrates another embodiment of a three layer dual chamber DIS dosimeter of the invention.

FIG. 7 shows an illustrative DIS radiation detector 30' similar to the DIS radiation detector 30 of FIG. 2a except for having two chambers 35', 36' of different sizes. Same references relate to same elements in FIGS. 2A and 7. Concavity 37 in top layer 33 communicates through opening 100 in MOSFET layer 32 with concavity 47 in bottom layer 34 through MOSFET layer 32 to increase the size of ion chamber 35' and concavity 38 in top layer 33 communicates through opening 102 in MOSFET layer 32 with concavity 48 in bottom layer 34 through MOSFET layer 32 to increase the size of ion chamber 36'.

Figure 8:
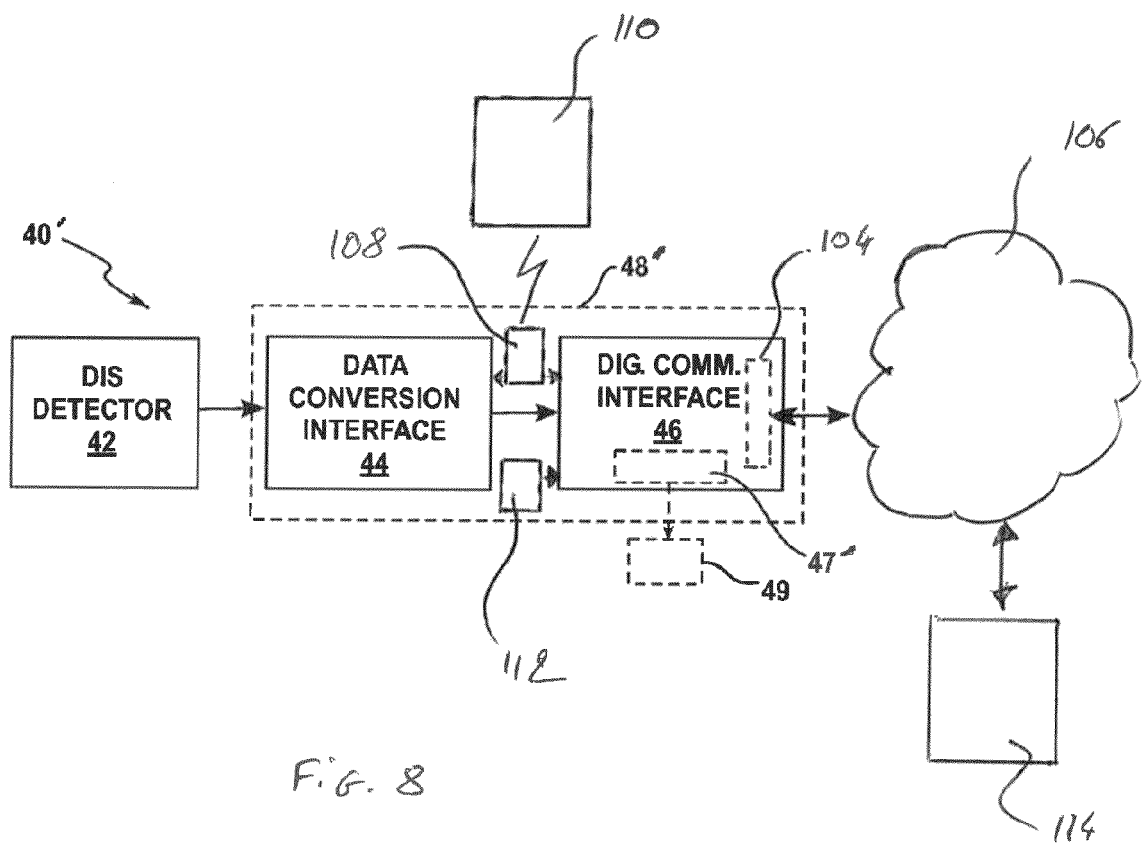
FIG. 8 illustrates another embodiment of a block diagram of the components of a DIS dosimeter of the invention.

FIG. 8 shows a block diagram of the components of a DIS dosimeter 40' of an embodiment of the invention, wherein similar references represent the same references as in the DIS dosimeter 40' of FIG. 3. Further, the communications interface 46 of DIS dosimeter 40' includes a data integrity checking and encryption module 104, wherein DIS dosimeter 40' is connected to the internet 106 through communications interface 46. In FIG. 8, the DIS dosimeter 40' comprises a power supply module 108 that allows to power data conversion and communications interfaces 44, 46 inductively or by RF interrogation using an external power supply module 110. In FIG. 8, the DIS dosimeter 40' further comprises a locator device 112. In FIG. 8, the DIS dosimeter 40' is provided for transmitting data to a central station 114 for processing, and receiving reports back from the central station, wherein transmitting data to the central station and receiving reports back are performed over the internet 106.

FIG. 9 is an organigram illustrating a method according to an embodiment of the invention.

The method comprises attaching (200) a direct ion storage (DIS) radiation dosimeter to a plurality of objects, containers or persons to be screened for radioactive sources; said plurality of objects, containers or persons to be screened for radioactive sources being transported from a first location to a second location; said DIS radiation dosimeter comprising: a first layer having a MOSFET structure formed thereon by semiconductor processing techniques, the MOSFET structure having a floating gate with an exposed surface; a second layer having a concavity therein; a third layer, having a concavity therein; the first layer being sandwiched between the second and third layer, the three layers being bonded together to form a hermetic seal; wherein the concavity in the second layer, and the concavity in the third layer, are aligned with the exposed surface of the floating gate and the concavity in the second layer communicates with the concavity in the third layer through the first layer to form an ion chamber; each dosimeter having an integral wired (such as USB) or wireless communications interface.

The method further comprises (202) reading each dosimeter through its communications interface before the associated object, container, or person leaves the first location.

The method further comprises reading (204) each dosimeter through its communications interface when the associated object, container, or person arrives at the second location.

The method further comprises transmitting (206) data read from the dosimeters at the first and second locations to a central station.

While the ability to easily read out data from the dosimeter by providing an internal communications interface is an important aspect of the invention, an optional feature is to have two way communications. If the reader is a PC, then the user can get feedback, i.e. reports, on the PC display. However, in some cases, particularly in the field, it may be desirable to add an alarm receiver circuit to the dosimeter so that the central station can send an alarm signal to the individual dosimeter. This signal could then actuate a visual indicator, e.g. light, color bar, or numeric value display, sound, vibration or other indicator to alert the user. The digital communications interface 46 of FIG. 3 could include an alarm signal receiver 47' connected to an indicator device 49.

While the dosimeters of the invention can be used alone, or as parts of the multi-dosimeter systems, they may also be incorporated as subcomponent parts of other devices. For example, the dosimeters could be part of a cell phone, radio, smoke detector, electronic dosimeter, surveillance camera and other communications or monitoring devices.

While the DIS dosimeter of the invention has been implemented with a MOSFET with exposed floating gate, other nonvolatile charge storage elements could be used if they become available.

The invention thus provides an improved DIS radiation detector or dosimeter that is easy and low cost to manufacture using well known semiconductor processing techniques. The detectors include internal communications interfaces so they are easy to read. Different interfaces, including USB ports and wireless interfaces, may be used, so that the dosimeters may be read over the Internet. The detectors can thus be deployed or used in a variety of detection systems and screening methods.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

Concepts

As short summaries, this writing has disclosed at least the following broad concepts.

Concept 1. A direct ion storage (DIS) radiation dosimeter, comprising:
  a first layer having a MOSFET structure formed thereon by semiconductor processing techniques, the MOSFET structure having a floating gate with an exposed surface;
  a second layer having a concavity therein;
  a third layer, optionally having a concavity therein;
  the first layer being sandwiched between the second and third layer, the three layers being bonded together to form a hermetic seal;
  wherein the concavity in the second layer, and any concavity in the third layer, are aligned with the exposed surface of the floating gate to form an ion chamber.

Concept 2. The dosimeter of Concept 1 wherein the first layer has more than one MOSFET structure formed thereon, and the second layer has a corresponding number of concavities, and the third layer optionally has a corresponding number of concavities, to form an ion chamber over each MOSFET structure.

Concept 3. The dosimeter of Concept 2 wherein each ion chamber has a different size.

Concept 4. The dosimeter of Concept 2 wherein each ion chamber is filled with a different gas.

Concept 5. The dosimeter of Concept 2 wherein each ion chamber is filled with a gas at a different pressure.

Concept 6. A direct ion storage (DIS) radiation dosimeter, comprising:
  a MOSFET having a floating gate with an exposed surface;
  a data conversion interface electrically connected to the MOSFET;
  a communications interface connected to the output of the data conversion interface;
  the data conversion and communications interfaces being integral to the dosimeter.

Concept 7. The dosimeter of Concept 6 wherein the communications interface is a wired interface.

Concept 8. The dosimeter of Concept 7 wherein the communications interface is a USB port or connection.

Concept 9. The dosimeter of Concept 6 wherein the communications interface is a wireless interface.

Concept 10. The dosimeter of Concept 6 wherein the communications interface includes data integrity checking and encryption.

Concept 11. The dosimeter of Concept 6 wherein the dosimeter is connected to the internet through the communications interface.

Concept 12. The dosimeter of Concept 6 wherein the data conversion and communications interfaces are externally powered.

Concept 13. The dosimeter of Concept 12 wherein the data conversion and communications interfaces are powered inductively or by RF interrogation, or by electrical connection to an external power source.

Concept 14. The dosimeter of Concept 6 wherein the communications interface further comprises an alarm signal receiving circuit.

Concept 15. The dosimeter of Concept 14 further comprising an indicator device connected to the alarm signal receiving circuit.

Concept 16. A system for screening a plurality of persons, objects, or containers at a location for radiation exposure or for radioactive sources carried therein or thereon, comprising:
  a plurality of dosimeters, a dosimeter being attached to each person, object, or container present at the location, each dosimeter having an integral communications interface;
  a dosimeter reader at the location for reading each dosimeter through its communications interface on a one time or on a periodic basis.

Concept 17. The system of Concept 16 wherein the communications interface in each dosimeter is a wired or a wireless communications interface.

Concept 18. The system of Concept 17 wherein the interface is a USB interface.

Concept 19. The system of Concept 16 wherein the dosimeters are DIS, TLD, OSL, RPL, RC, MOSFET or other passive dosimeters.

Concept 20. The system of Concept 16 further comprising a central station to which the reader is connected by wired or wireless communication.

Concept 21. A system for screening a plurality of objects, containers or persons being transported from a first location to a second location for radioactive sources carried therein or thereon, comprising:
  a plurality of dosimeters, a dosimeter being attached to each object, container, or person present at the first location, each dosimeter having an integral communications interface;
  a first dosimeter reader at the first location for reading each dosimeter through its communications interface before the associated object, container, or person leaves the first location;
  a second dosimeter reader at the second location for reading each dosimeter through its communications interface when the associated object, container, or person arrives at the second location.

Concept 22. The system of Concept 21 wherein the communications interface in each dosimeter is a wired or a wireless communications interface.

Concept 23. The system of Concept 22 wherein the interface is a USB interface.

Concept 24. The system of Concept 21 wherein the dosimeters are DIS, TLD, OSL, RPL RC, MOSFET or other passive dosimeters.

Concept 25. The system of Concept 21 further comprising a central station to which the first and second readers are connected by wired or wireless communication.

Concept 26. A system for surveillance of an area for radioactive sources located therein, comprising:
  a plurality of dosimeters, each dosimeter being attached to a person or a vehicle that moves through the surveillance area, each dosimeter having an integral communications interface;
  a reader in communication with the dosimeters.

Concept 27. The system of Concept 26 wherein the communications interface in each dosimeter is a wired or a wireless communications interface.

Concept 28. The system of Concept 27 wherein the interface is a USB interface.

Concept 29. The system of Concept 26 wherein the dosimeters are DIS, TLD, OSL, RPL, RC, MOSFET or other passive dosimeters.

Concept 30. The system of Concept 26 wherein each dosimeter further comprises a locator device.

Concept 31. A method for screening a plurality of persons, objects, or containers at a location for radiation exposure or for radioactive sources carried therein or thereon, comprising:
attaching a dosimeter to each person, object, or container present at the location, each dosimeter having an integral communications interface;
reading each dosimeter at the location through its communications interface on a one time or a periodic basis.

Concept 32. The method of Concept 31 wherein the communications interface in each dosimeter is a wired or a wireless communications interface.

Concept 33. The method of Concept 32 wherein the interface is a USB interface.

Concept 34. The method of Concept 31 wherein the dosimeters are DIS, TLD, OSL, RPL, RC, MOSFET or other passive dosimeters.

Concept 35. The method of Concept 31 further comprising transmitting data read from each dosimeter at the location to a central station for processing, and receiving reports back from the central station.

Concept 36. The method of Concept 35 wherein transmitting data to the central station and receiving reports back are performed over the internet.

Concept 37. A method for screening a plurality of objects, containers or persons being transported from a first location to a second location for radioactive sources carried therein or thereon, comprising:
attaching a dosimeter to each object, container, or person present at the first location, each dosimeter having an integral communications interface;
reading each dosimeter through its communications interface before the associated object, container, or person leaves the first location;
reading each dosimeter through its communications interface when the associated object, container, or person arrives at the second location.

Concept 38. The method of Concept 37 wherein the communications interface in each dosimeter is a wired or a wireless communications interface.

Concept 39. The method of Concept 38 wherein the interface is a USB interface.

Concept 40. The method of Concept 37 wherein the dosimeters are DIS, TLD, OSL, RPL, RC, MOSFET or other passive dosimeters.

Concept 41. The method of Concept 37 further comprising transmitting data read from the dosimeters at the first and second locations to a central station.

Concept 42. A method for surveillance of an area for radioactive sources located therein, comprising:
attaching a plurality of dosimeters to persons or vehicles that move through the surveillance area, each dosimeter having an integral communications interface;
monitoring the plurality of mobile dosimeters at a reader in communication with the dosimeters.

Concept 43. The method of Concept 42 wherein the communications interface in each dosimeter is a wired or a wireless communications interface.

Concept 44. The method of Concept 43 wherein the interface is a USB interface.

Concept 45. The method of Concept 42 wherein the dosimeters are DIS, TLD, OSL, RPL, RC, MOSFET or other passive dosimeters.

Concept 46. The method of Concept 42 wherein each dosimeter further comprises a locator device.

Concept 47. The method of Concept 42 wherein the reader is located at a central station.

Concept 48. The method of Concept 42 further comprising transmitting data from the reader to a central station.

Concept 49. A direct ion storage (DIS) radiation dosimeter package, comprising:
a housing having an aperture in an end thereof;
a frame fitting inside and slidably mounted in the housing;
a DIS radiation sensor mounted on the frame;
a data collection and data readout integrated circuit electrically connected to the DIS radiation sensor and mounted on the frame;
the data collection and data readout integrated circuit having a USB connection at one end thereof proximal to the aperture;
a base element rotatably attached to housing so that as the base element is rotated, the frame slides toward the aperture and the USB connection extends outside the aperture.

What is claimed is:

1. A method of making a direct ion storage (DIS) radiation dosimeter comprising:
forming a first layer having MOSFET structure thereon by semiconductor processing techniques, the MOSFET structure having a floating gate with an exposed surface;
forming a second layer having a concavity therein;
forming a third layer, having a concavity therein;
sandwiching the first layer between the second and third layer;
bonding the three layers together to form hermetic seal;
wherein:
the concavity in the second layer and the concavity in the third layer are aligned with the exposed surface of the floating gate and the concavity in the second layer communicates with the concavity in the third layer through the first layer to form an ion chamber.

2. The method of claim 1 wherein the first layer is formed of a silicon substrate.

3. The method of claim 1 further comprising forming conducting electrical lines on the first layer so that electrical connection can be made to MOSFET structure.

4. The method of claim 1 wherein the second and third layers are formed of metal or conducting polymer.

5. A direct ion storage (DIS) radiation dosimeter package, comprising:
a housing having an aperture in an end thereof;
a frame fitting inside and slidably mounted in the housing;
a DIS radiation sensor mounted on the frame;
a data collection and data readout integrated circuit electrically connected to the DIS radiation sensor and mounted on the frame;
the data collection and data readout integrated circuit having a USB connection at one end thereof proximal to the aperture;
a base element rotatably attached to the housing so that as the base element is rotated, the frame slides toward the aperture and the USB connection extends outside the aperture,
wherein the DIS radiation sensor comprises:
a first layer having a MOSFET structure formed thereon by semiconductor processing techniques, the MOSFET structure having a floating gate with an exposed surface;

a second layer having a concavity therein;
a third layer, optionally having a concavity therein;
the first layer being sandwiched between the second and third layer, the three layers being bonded together to form a hermetic seal;
wherein the concavity in the second layer, and any concavity in the third layer, are aligned with the exposed surface of the floating gate to form an ion chamber.

6. A direct ion storage (DIS) radiation dosimeter package, comprising:
a housing having an aperture in an end thereof;
a frame fitting inside and slidably mounted in the housing;
a DIS radiation sensor mounted on the frame;
a data collection and data readout integrated circuit electrically connected to the DIS radiation sensor and mounted on the frame;
the data collection and data readout integrated circuit having a USB connection at one end thereof proximal to the aperture;
a base element rotatably attached to the housing so that as the base element is rotated, the frame slides toward the aperture and the USB connection extends outside the aperture,
wherein the data collection and data readout integrated circuit includes data integrity checking and encryption.

7. A direct ion storage (DIS) radiation dosimeter package, comprising:
a housing having an aperture in an end thereof;
a frame fitting inside and slidably mounted in the housing;
a DIS radiation sensor mounted on the frame;
a data collection and data readout integrated circuit electrically connected to the DIS radiation sensor and mounted on the frame;
the data collection and data readout integrated circuit having a USB connection at one end thereof proximal to the aperture;
a base element rotatably attached to the housing so that as the base element is rotated, the frame slides toward the aperture and the USB connection extends outside the aperture,
wherein:
the data collection and data readout integrated circuit is externally powered.

8. The DIS radiation dosimeter package of claim 7 wherein the data collection and data readout integrated circuit is powered inductively or by RF interrogation, or by electrical connection to an external power source.

9. A direct ion storage (DIS) radiation dosimeter package, comprising:
a housing having an aperture in an end thereof;
a frame fitting inside and slidably mounted in the housing;
a DIS radiation sensor mounted on the frame;
a data collection and data readout integrated circuit electrically connected to the DIS radiation sensor and mounted on the frame;
the data collection and data readout integrated circuit having a USB connection at one end thereof proximal to the aperture;
a base element rotatably attached to the housing so that as the base element is rotated, the frame slides toward the aperture and the USB connection extends outside the aperture, wherein the data collection and data readout integrated circuit further comprises an alarm signal receiving circuit.

10. The DIS radiation dosimeter package of claim 9 further comprising an indicator device connected to the alarm signal receiving circuit.

11. A direct ion storage (DIS) radiation dosimeter, comprising:
a first layer having a MOSFET structure formed thereon by semiconductor processing techniques, the MOSFET structure having a floating gate with an exposed surface;
a second layer having a concavity therein;
a third layer, having a concavity therein;
the first layer being sandwiched between the second and third layer, the three layers being bonded together to form a hermetic seal;
wherein the concavity in the second layer, and the concavity in the third layer, are aligned with the exposed surface of the floating gate and the concavity in the second layer communicates with the concavity in the third layer through the first layer to form an ion chamber.

12. The dosimeter of claim 11, wherein:
the first layer has more than one MOSFET structure formed thereon,
the second layer has as many concavities as the first layer has MOSFET structures, and
the third layer has as many concavities as the first layer has MOSFET structures, to form an ion chamber over each MOSFET structure.

13. The dosimeter of claim 12 wherein each ion chamber has a different size.

14. The dosimeter of claim 12 wherein each ion chamber is filled with a different gas.

15. The dosimeter of claim 12 wherein each ion chamber is filled with a gas at a different pressure.

16. The dosimeter of claim 12 further comprising:
a data conversion interface electrically connected to the MOSFET structure;
a communications interface connected to the output of the data conversion interface;
the data conversion and communications interfaces being integral to the dosimeter.

17. The dosimeter of claim 16 wherein the communications interface is a wired interface.

18. The dosimeter of claim 17 wherein the communications interface is a USB port or connection.

19. The dosimeter of claim 16 wherein the communications interface is a wireless interface.

20. The dosimeter of claim 16 wherein the communications interface includes data integrity checking and encryption.

21. The dosimeter of claim 16 wherein the dosimeter is connected to the internet through the communications interface.

22. The dosimeter of claim 16 wherein the data conversion and communications interfaces are externally powered.

23. The dosimeter of claim 22 wherein the data conversion and communications interfaces are powered inductively or by RF interrogation, or by electrical connection to an external power source.

24. The dosimeter of claim 16 wherein the communications interface further comprises an alarm signal receiving circuit.

25. The dosimeter of claim 24 further comprising an indicator device connected to the alarm signal receiving circuit.

26. The direct ion storage (DIS) radiation dosimeter according to claim 11, comprising:
a data conversion interface electrically connected to the MOSFET structure;
a communications interface connected to the output of the data conversion interface;
the data conversion and communications interfaces being integral to the dosimeter.

27. The dosimeter of claim 26 wherein the communications interface is a wired interface.

28. The dosimeter of claim 27 wherein the communications interface is a USB port or connection.

29. The dosimeter of claim 26 wherein the communications interface is a wireless interface.

30. The dosimeter of claim 26 wherein the communications interface is arranged for performing data integrity checking and encryption.

31. The dosimeter of claim 26 wherein the dosimeter is connected to the internet through the communications interface.

32. The dosimeter of claim 26 wherein the data conversion and communications interfaces are externally powered.

33. The dosimeter of claim 32 wherein the data conversion and communications interfaces are powered inductively or by RF interrogation, or by electrical connection to an external power source.

34. The dosimeter of claim 26 wherein the communications interface further comprises an alarm signal receiving circuit.

35. The dosimeter of claim 34 further comprising an indicator device connected to the alarm signal receiving circuit.

36. A system for screening a plurality of persons, objects, or containers at a location for radiation exposure or for radioactive sources carried therein or thereon, comprising:
a plurality of dosimeters according to claim 11, each dosimeter being attached to each person, object, or container present at the location, each dosimeter having an integral communications interface;
a dosimeter reader at the location for reading each dosimeter through its communications interface on a one time or on a periodic basis.

37. The system of claim 36 wherein the communications interface in each dosimeter is a wired or a wireless communications interface.

38. The system of claim 37 wherein the interface is a USB interface.

39. The system of claim 36 further comprising a central station to which the reader is connected by wired or wireless communication.

40. A system for screening a plurality of objects, containers or persons being transported from a first location to a second location for radioactive sources carried therein or thereon, comprising:
a plurality of dosimeters according to claim 11, each dosimeter being attached to each object, container, or person present at the first location, each dosimeter having an integral communications interface;
a first dosimeter reader at the first location for reading each dosimeter through its communications interface before the associated object, container, or person leaves the first location;
a second dosimeter reader at the second location for reading each dosimeter through its communications interface when the associated object, container, or person arrives at the second location.

41. The system of claim 40 wherein the communications interface in each dosimeter is a wired or a wireless communications interface.

42. The system of claim 41 wherein the interface is a USB interface.

43. The system of claim 40 further comprising a central station to which the first and second readers are connected by wired or wireless communication.

44. A system for surveillance of an area for radioactive sources located therein, comprising:
a plurality of dosimeters according to claim 11, each dosimeter being attached to a person or a vehicle capable of moving through the surveillance area, each dosimeter having an integral communications interface;
a reader in communication with the dosimeters.

45. The system of claim 44 wherein the communications interface in each dosimeter is a wired or a wireless communications interface.

46. The system of claim 45 wherein the interface is a USB interface.

47. The system of claim 44 wherein each dosimeter further comprises a locator device.

48. A method for screening a plurality of persons, objects, or containers at a location for radiation exposure or for radioactive sources carried therein or thereon, comprising:
attaching a dosimeter according to claim 11 to each person, object, or container present at the location, each dosimeter having an integral communications interface;
reading each dosimeter at the location through its communications interface on a one time or a periodic basis.

49. The method of claim 48 wherein the communications interface in each dosimeter is a wired or a wireless communications interface.

50. The method of claim 49 wherein the interface is a USB interface.

51. The method of claim 48 further comprising transmitting data read from each dosimeter at the location to a central station for processing, and receiving reports back from the central station.

52. The method of claim 49 wherein transmitting data to the central station and receiving reports back are performed over the internet.

53. A method for screening a plurality of objects, containers or persons being transported from a first location to a second location for radioactive sources carried therein or thereon, comprising:
attaching a dosimeter according to claim 11 to each object, container, or person present at the first location, each dosimeter having an integral communications interface;
reading each dosimeter through its communications interface before the associated object, container, or person leaves the first location;
reading each dosimeter through its communications interface when the associated object, container, or person arrives at the second location.

54. The method of claim 53 wherein the communications interface in each dosimeter is a wired or a wireless communications interface.

55. The method of claim 53 wherein the interface is a USB interface.

56. The method of claim 53 further comprising transmitting data read from the dosimeters at the first and second locations to a central station.

57. A method for surveillance of an area for radioactive sources located therein, comprising:
attaching a plurality of dosimeters according to claim 11 to persons or vehicles capable of moving through the surveillance area, each dosimeter having an integral communications interface;
monitoring the plurality of mobile dosimeters at a reader in communication with the dosimeters.

58. The method of claim 57 wherein the communications interface in each dosimeter is a wired or a wireless communications interface.

59. The method of claim 58 wherein the interface is a USB interface.

60. The method of claim 57 wherein each dosimeter further comprises a locator device.

61. The method of claim 57 wherein the reader is located at a central station.

62. The method of claim 57 further comprising transmitting data from the reader to a central station.

* * * * *